(12) United States Patent
Komoriya et al.

(10) Patent No.: US 8,016,585 B2
(45) Date of Patent: Sep. 13, 2011

(54) NANOIMPRINT RESIN STAMPER

(75) Inventors: Susumu Komoriya, Ashigarakami-gun (JP); Kyoichi Mori, Ashigarakami-gun (JP); Noritake Shizawa, Ashigarakami-gun (JP); Takanori Yamasaki, Chiyoda-ku (JP); Tetsuhiro Hatogai, Chiyoda-ku (JP); Koji Tsushima, Ashigarakami-gun (JP)

(73) Assignee: Hitachi High-Technologies Corporation, Tokyo (JP)

( * ) Notice: Subject to any disclaimer, the term of this patent is extended or adjusted under 35 U.S.C. 154(b) by 323 days.

(21) Appl. No.: 12/270,376

(22) Filed: Nov. 13, 2008

(65) Prior Publication Data

US 2009/0123590 A1 May 14, 2009

(30) Foreign Application Priority Data

Nov. 14, 2007 (JP) ................. 2007-295458

(51) Int. Cl.
*B29C 59/00* (2006.01)
*B29B 13/08* (2006.01)
(52) U.S. Cl. ............. 425/385; 425/174.4; 264/293
(58) Field of Classification Search ........... 425/387.1, 425/385, 174.4; 264/293
See application file for complete search history.

(56) References Cited

U.S. PATENT DOCUMENTS

| | | | | |
|---|---|---|---|---|
| 5,817,242 A * | 10/1998 | Biebuyck et al. | ............... | 216/41 |
| 5,947,027 A * | 9/1999 | Burgin et al. | ................. | 101/474 |
| 6,309,580 B1 * | 10/2001 | Chou | ........................... | 264/338 |
| 6,354,827 B1 * | 3/2002 | Kerfeld | ......................... | 425/195 |
| 6,580,172 B2 * | 6/2003 | Mancini et al. | ................ | 257/762 |
| 6,887,792 B2 * | 5/2005 | Perlov et al. | .................... | 438/703 |
| 2006/0286490 A1 * | 12/2006 | Sandhu et al. | ................ | 430/394 |
| 2009/0004320 A1 * | 1/2009 | Ohashi et al. | .................. | 425/385 |
| 2009/0155516 A1 * | 6/2009 | Kobayashi et al. | .......... | 428/65.1 |

FOREIGN PATENT DOCUMENTS

| | | | | |
|---|---|---|---|---|
| JP | 2007-55235 | | 3/2007 | |
| JP | PCT/JP2007/063675 | * | 1/2008 | ................... 428/65.1 |

OTHER PUBLICATIONS

"Imprint of sub-25 nm vias and trenches in polymers" by Chou, et al., Appl. Phys. Lett. 67 (21), Nov. 20, 1995.
"Recent Trend of Nanoimprint Technique" by Jun. Taniguchi, et al., vol. 46, No. 6, Jun. 2002. 282-285.
"Nanostructure Fabrication by Nanoimprint Technology", Y. Hirai., vol. 70, No. 10, 2004.

* cited by examiner

*Primary Examiner* — Maria Veronica D Ewald
(74) *Attorney, Agent, or Firm* — Mattingly & Malur, PC

(57) ABSTRACT

A resin stamper is provided that is intended for use in an optical transfer-based nanostructure transfer apparatus and which is capable of automatic transport and alignment. The resin stamper includes a support member made of a light transmitting material and having mechanical strength, an intermediate layer also made of a light transmitting material, and a patterned resin layer which is also made of a light transmitting material. The support member is larger in size than the intermediate layer and the patterned resin layer. The intermediate layer is more flexible than the patterned resin layer. Also, the patterned resin layer has a pattern of high and low areas formed in a surface thereof that is the obverse of the pattern of high and low areas in a mold.

12 Claims, 5 Drawing Sheets

(e)

(f)

NANOIMPRINT RESIN STAMPER

FIELD OF THE INVENTION

The present invention relates to a nanoimprint resin stamper and a nanostructure transfer apparatus using the stamper. More particularly, the present invention relates to a nanoimprint resin stamper that has sufficient mechanical strength to be capable of providing automatic transport and alignment while exhibiting a high level of handling properties; the invention also relates to a nanostructure transfer apparatus having a mechanism that enables the stamper to be easily stripped from a transfer substrate after the transfer of a nanostructure.

BACKGROUND OF THE INVENTION

With remarkable advances in the performance of computers and other information equipment, the volume of information that is handled by users has been constantly increasing and is now measured in gigabytes as a unit. Under these circumstances, there exists an ever-growing demand for semiconductor devices such as information storage/reproduce equipment and memories that are capable of recording at even higher densities.

To achieve higher recording densities, technologies for even finer microfabrication are required. Conventional photolithography which uses the exposure process is capable of microfabrication over a large area in one step; however, since its resolution is not finer than the wavelength of light, conventional photolithography is inevitably unsuitable for creating fine structures smaller than the wavelength of light (say, 100 nm and less). Technologies currently available for processing finer structures than the wavelength of light include exposure using electron beams, exposure using X-rays, and exposure using ion beams. However, pattern formation with an electron beam lithographic apparatus differs from patterning by one-shot exposure using such light sources as i-line and an excimer laser in that the more patterns that need be written with electron beams, the longer the time that is required for writing (exposure). Therefore, as the recording density increases, the time it takes to form a fine pattern is extended to cause a marked drop in throughput. With a view to forming patterns at a faster speed by the e-beam lithographic equipment, the development of a method for one-shot irradiation of geometric figures is underway in which combinations of variously shaped masks are subjected to one-shot exposure to electron beams; however, the e-beam lithographic apparatus that uses the method for one-shot irradiation of geometric figures is not only bulky but it also needs an additional mechanism for controlling the positions of mask to an even higher precision; this increases the cost of the lithographic apparatus, eventually leading to a higher cost for manufacturing media.

Printing-based approaches have been proposed as an alternative to the conventional exposure technologies for creating fine structures smaller than the wavelength of light. See, for example, the article titled "Imprint of sub-25 nm vias and trenches in polymers" that is carried in S. Y. Chou et al., Appl. Phys. Lett., Vol. 67, No. 21, 20 Nov. 1995, pp. 3114-3116. Nanoimprint lithography (NIL) is a technique in which a pattern of a predetermined fine structure is formed on a master by exposure to electron beams or using some other methods of creating finer structures than the wavelength of light and the master is urged under pressure against a resist-coated transfer substrate so that the fine structured pattern is transferred to the resist layer on the transfer substrate. As long as the master is available, there is no particular need to employ an expensive exposure apparatus but an apparatus in the class of ordinary printing presses will suffice to produce replicas in large quantities; hence, in comparison with the conventional methods such as exposure to electron beams, there is achieved a marked improvement in throughput whereas the manufacturing cost is significantly reduced.

When a thermoplastic resin is used as a resist material in the nanoimprint lithographic (NIL) technology, transfer is performed with the thermoplastic resin being heated under pressure to a temperature near its glass transition temperature (Tg) or higher. This approach is called a heat transfer technique and described in Yoshihiko HIRAI, Nanostructure Fabrication by Nanoimprint Technology, Journal of the Japan Society for Precision Engineering, Vol. 70, No. 10, 2004, pp. 1223-1227. The heat transfer technique has the advantage of permitting the use of general-purpose, thermoplastic resins. If a photosensitive resin is used as a resist in the NIL technology, a photocurable resin that cures upon exposure to light such as ultraviolet (UV) radiation is chosen as the resin to which the original fine pattern is transferred. This approach is called an optical transfer technique and described in Jun TANIGUCHI et al., Recent trend of nanoimprint technique, Journal of the Society for Abrasive Technology, Vol. 46, No. 6, June 2002, pp. 282-285.

In the imprint processing technology using the optical transfer technique, a special photocurable resin must be used but, on the other hand, it has the advantage of reducing the dimensional errors in finished products due to the thermal expansion of transfer printing plates or printing media. Other advantages that are related to the apparatus include elimination of the need for equipping it with a heating mechanism and providing accessories such as for performing temperature elevation, temperature control, and cooling. There is a further advantage concerning the imprint apparatus taken as a whole and that is elimination of the need for design considerations against thermal distortions, such as heat insulation.

An example of imprint apparatuses based on the optical transfer technique is described in Jun TANIGUCHI et al., Recent trend of nanoimprint technique, Journal of the Society for Abrasive Technology, Vol. 46, No. 6, June 2002, pp. 282-285. This apparatus is so designed that a quartz or sapphire mold capable of transmitting UV light is urged against a photocurable resin coated transfer substrate and irradiated with UV light from above. However, the patterned structure on the rigid quartz or sapphire mold is known to be easily damaged when the mold is pressed into contact with a rigid transfer substrate. As a further problem, in order to strip the mold fro the transfer substrate, it has been necessary to drive a wedge into the interface between the mold and the substrate. This has caused problems such as damaging of the mold or the occurrence of foreign matter in large quantities. The quartz or sapphire mold is not only very expensive but if it should be damaged, it is generally impossible to repair or reuse. In addition, if foreign matter gets seated between the mold and the transfer substrate or if any irregular protrusions from a surface of the transfer substrate create gaps between the mold and the transfer substrate, a subsequent pattern formation from the photocurable resin produces a base layer whose thickness is greater than it should be by an amount that corresponds to the created gaps. This thick base layer is impossible to remove by etching, which eventually becomes a major cause of a poorly etched final product.

With a view to solving these problems, JP 2007-55235 A proposed that a polymer stamp, or a polymeric material to which the pattern on a rigid mold has been transferred, should be substituted for the rigid mold as a secondary replica. Since the polymer stamp is flexible and elastic, it can be forcefully pressed into contact with a rigid transfer substrate, with only a small likelihood for the occurrence of unwanted accidents such as nicking of the pattern on the stamp. In addition, even if some foreign matter or protrusions occur between the stamp and the transfer substrate, the stamp itself is flexible and elastic enough to undergo a flexural deformation that allows it conform to the foreign matter or protrusions. Furthermore, the entire surface of the stamp except in the areas where the protrusions or foreign matter occurs makes intimate contact with the transfer substrate, so the thickness of the base film becomes thin enough to permit its removal by etching. Given the rigid mold, as many polymer stamps as are required can be produced, so the polymer stamps themselves can be manufactured at such a low cost that they may be discarded after being used once or several times. Notwithstanding these advantages, the polymer stamps which are at most about one millimeter thick are difficult to transport and/or align automatically and have hence involved difficulty in handling. A further problem is posed by the need to strip or separate the polymer stamp from the transfer substrate after it has been pressed into contact with the latter and subjected to photo-curing: due to its poor strippability, the polymer stamp has often remained unremoved on the transfer substrate. If this occurs, it has been necessary to strip the polymer stamp by treatment with a suitable solvent that dissolves the polymer stamp but does not dissolve the transfer substrate and the patterned resin layer on top of it.

SUMMARY OF THE INVENTION

The present invention has been accomplished in order to solve the aforementioned problems of the prior art and has as an object providing a stamper that is intended for use in an optical transfer-based nanostructure transfer apparatus and which is capable of automatic transport and alignment.

Another object of the present invention is to provide an optical transfer-based nanostructure transfer apparatus having a mechanism capable of automatic stripping of the stamper from a transfer substrate.

As a means for attaining the first object stated above, the invention as recited in appendant claim 1 provides a resin stamper for use in an UV nanoimprint process which comprises a support member made of a light transmitting material and having mechanical strength, an intermediate layer also made of a light transmitting material, and a patterned resin layer which is also made of a light transmitting material, the support member being larger in size than the intermediate layer and the patterned resin layer, the intermediate layer being more flexible than the patterned resin layer, and the patterned resin layer having a pattern of high and low areas formed in a surface thereof that is the obverse of the pattern of high and low areas in a mold.

According to this invention, the vulnerable and difficult-to-strip rigid mold is replaced by a less vulnerable and easy-to-strip flexible mold, with the result that the throughput of the UV nanoimprint process is markedly improved. The mold is expensive and cannot be reused once damaged; on the other hand, given the mold, as many resin stampers as are desired can be replicated at low cost. In addition, since the support member is larger in size than the intermediate layer and the patterned resin layer, the resin stamper can be transported and aligned automatically by holding the support member having mechanical strength. Furthermore, since the highly flexible intermediate layer is capable of elastic deformation, the effects of any foreign matter or protrusions on the transfer substrate can be mitigated.

As a means for attaining the first object stated above, the invention as recited in appendant claim 2 is the same as the resin stamper according to claim 1, except that it further includes a planarizing film made of a light transmitting material that is present at the interface between the intermediate layer and the patterned resin layer.

According to this invention, the planarizing film helps improve the planar precision of the intermediate layer and, hence, the planar precision of the patterned resin layer.

As a means for attaining the first object stated above, the invention as recited in appendant claim 3 is the same as the resin stamper according to claim 1, except that it further includes a release treated film made of a light transmitting material that is present on a surface of the patterned resin layer.

According to this invention, the presence of the release treated film markedly enhances the strippability of the resin stamper from a transfer substrate.

As a means for attaining the first object stated above, the invention as recited in appendant claim 4 is the same as the resin stamper according to claim 1, except that the support member is made of a material selected from the group consisting of glass, quartz, sapphire, and transparent plastics, that the intermediate layer is made of a material selected from the group consisting of a polyurethane rubber sheet, a silicone rubber sheet, and an acrylic rubber sheet, and that the patterned resin layer is made of a material selected from the group consisting of an UV curable polyester and an acrylic rubber.

According to this invention, materials that are optimum for the resin stamper of the present invention can be chosen and used in combination.

As a means for attaining the second object stated above, the invention as recited in appendant claim 5 provides a nanostructure transfer apparatus that uses the resin stamper according to claim 1 as a mold, comprising a stage supported by an ascending/descending mechanism and a placement table with a curved surface that is provided over the stage, the placement table having a cushion layer that is provided over a surface of the placement table and which conforms to the curved surface thereof, further including a clamp mechanism for clamping a transfer substrate onto the placement table as it is placed on top of the cushion layer over the placement table, wherein the patterned resin layer of the resin stamper is smaller in size than the transfer substrate.

According to this invention, since the patterned resin layer of the resin stamper is smaller in size than the transfer substrate, a specified UV nanoimprint operation can be performed on the transfer substrate by means of the resin stamper while the transfer substrate is being clamped by the clamp mechanism and, after the imprinting operation, the resin stamper can be automatically stripped from the transfer substrate by descending the stage as the transfer substrate remains clamped by the clamp mechanism.

Thus, according to one aspect of the present invention, the vulnerable and difficult-to-strip rigid mold is replaced by a less vulnerable and easy-to-strip flexible mold, with the result that the throughput of the UV nanoimprint process is markedly improved. The rigid mold fabricated with an e-beam lithographic apparatus is expensive and cannot be reused once damaged; on the other hand, given the mold, as many resin stampers as are desired can be replicated at low cost. In addition, since the support member is larger in size than the intermediate layer and the patterned resin layer, the resin stamper can be transported and aligned automatically by holding the support member having mechanical strength. Furthermore, since the highly flexible intermediate layer is capable of elastic deformation, the effects of any foreign matter or protrusions on the transfer substrate can be mitigated.

According to the other aspect of the present invention, since the patterned resin layer of the resin stamper is smaller in size than the transfer substrate, a specified UV nanoimprint operation can be performed on the transfer substrate by means of the resin stamper while the transfer substrate is being clamped by the clamp mechanism and, after the imprinting operation, the resin stamper can be automatically stripped from the transfer substrate by descending the stage as the transfer substrate remains clamped by the clamp mechanism. Consequently, problems that often occurred with the conventional nanostructure transfer apparatus, such as the damage to the rigid mold and the occurrence of foreign matter, can be entirely eliminated.

DETAILED DESCRIPTION OF THE PREFERRED EMBODIMENTS

On the following pages, the preferred embodiments of the nanoimprint resin stamper and nanostructure transfer apparatus of the present invention will be described in detail with reference to the accompanying drawings.

Figure 1A:
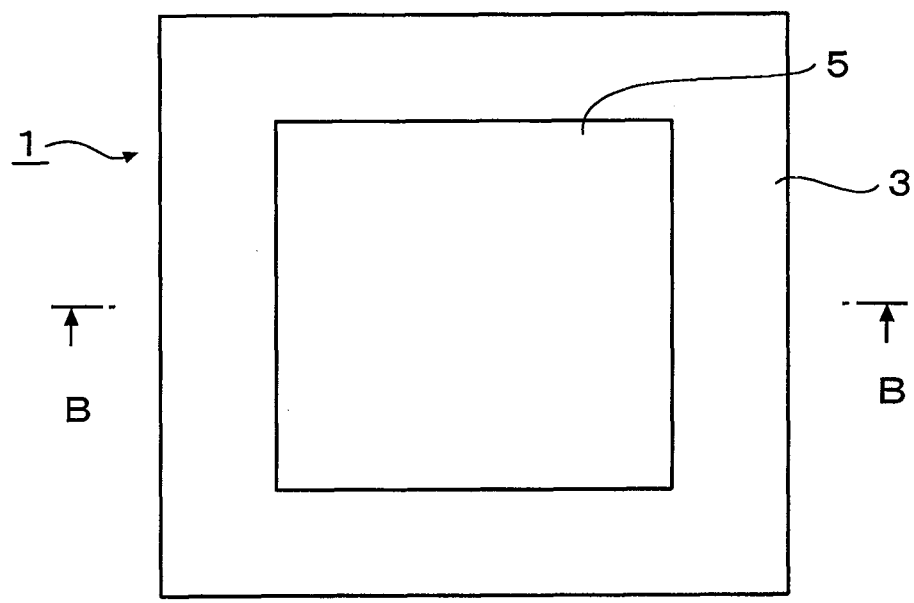
FIG. 1A is a plan view of the nanoimprint resin stamper according to the first aspect of the present invention.
Figure 1B:
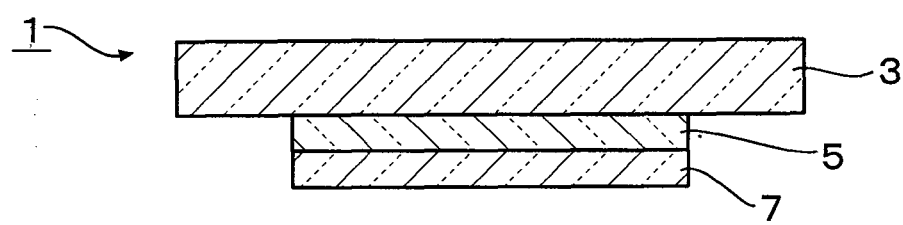
FIG. 1B shows a section of FIG. 1A as taken through line B-B.
Figure 2:
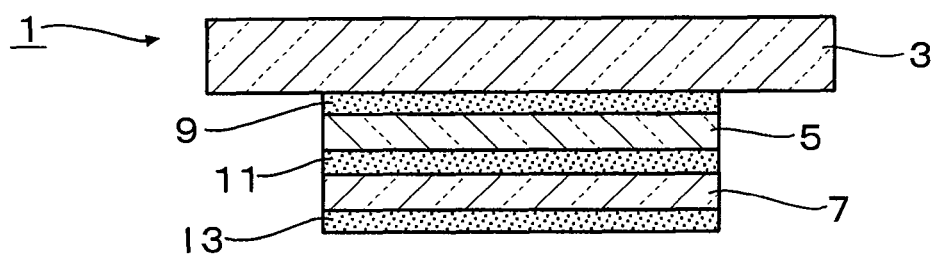
FIG. 2 is a diagrammatic sectional view showing in detail the constitution of the nanoimprint resin stamper shown in FIG. 1B.

FIG. 1A is a plan view of the nanoimprint resin stamper according to the first aspect of the present invention. FIG. 1B shows a section of FIG. 1A as taken through line B-B. FIG. 2 is a diagrammatic sectional view showing in detail the constitution of the nanoimprint resin stamper shown in FIG. 1B. The nanoimprint resin stamper of the present invention which is generally indicated by 1 is basically composed of a support member in plate form 3 which is made of a light transmitting material and has mechanical strength, an intermediate layer 5 provided on the underside of the support member 3 which is also made of a light transmitting material and has both flexibility and elasticity, and a patterned resin layer 7 provided on the underside of the intermediate layer 5 which is also made of a light transmitting material.

Since the nanoimprint resin stamper 1 of the present invention is to be used in an optical transfer-based nanostructure transfer apparatus, the support member 3 has to be made of a light transmitting material. Examples of the light transmitting material that can be used are glass, quartz, sapphire, and transparent plastics (e.g., acrylic resins and rigid polyvinyl chloride). From the viewpoint of economy, glass or acrylic resin plates are preferred. In order to enable machine-based automatic transport and alignment, the support member 3 is required to have mechanical strength. Hence, the support member 3 preferably has a thickness of about 0.5 mm to 10 mm. If the thickness of the support member 3 is less than 0.5 mm, it is difficult to attain the necessary and sufficient strength for enabling machine-based automatic transport and alignment. On the other hand, if the thickness of the support member 3 exceeds 10 mm, the mechanical strength obtained is more than the necessary and sufficient value and is simply uneconomical. The shape of the support member 3 is not limited to the illustrated rectangle. If desired, it may assume a shape that corresponds to the shape of the transfer substrate (which is not shown); for instance, if the transfer substrate (not shown) is disk-shaped, the support member 3 may also be shaped like a disk. Nevertheless, considering the ease of mechanical handling, the support member 3 is preferably rectangular in shape.

The intermediate layer 5 must also be formed of a light transmitting material. It must also possess flexibility and elasticity. Materials that satisfy these requirements include, for example, polyurethane rubbers, acrylic rubbers, and silicone rubbers. Polyurethane rubbers are preferred. The reason for using the flexible and elastic material in the intermediate layer 5 is as follows: even if some patterned protrusions or any foreign matter exists between the stamper 1 and the transfer substrate (not shown), the intermediate layer 5 which is made of the flexible and elastic material is compressed to sufficiently deform that it can accommodate or conform to the patterned protrusions or the foreign matter, which contributes not only to reducing the thickness of the resist base film in regions other than where the patterned protrusions or the foreign matter exists but also to protecting those patterned protrusions. To this end, it is generally preferred that the intermediate layer 5 has a thickness in the range of 0.1 mm to 10 mm. If the thickness of the intermediate layer 5 is less than 0.1 mm, it is difficult to attain the above-mentioned desirable effect. On the other hand, if the thickness of the intermediate layer 5 exceeds 10 mm, the intended effect is already saturated and making the intermediate layer 5 further thicker simply results in diseconomy.

The patterned resin layer 7 must also be formed of a light transmitting material. However, it need not be as flexible and elastic as the intermediate layer 5. Its flexibility and elasticity may be of such a degree that even if some patterned protrusions or any foreign matter exists between the stamper 1 and the transfer substrate (not shown), it is capable of sufficient flexural deformation to accommodate or conform to the protrusions or the foreign matter. The material to form the patterned resin layer 7 may be exemplified by polyester resins or acrylic rubbers. Ultraviolet (UV) curable polyester resins are particularly preferred since they have good mold release properties. The thickness of the patterned resin layer 7 is generally within the range of 0.001 mm to 0.2 mm. If the thickness of the patterned resin layer 7 is less than 0.001 mm, the amount of the resin coat as applied to form the resin pattern is so small that pattern defects are likely to occur. On the other hand, if the thickness of the patterned resin layer 7 exceeds 0.2 mm, its flexural rigidity is so high that it is only poorly that it can accommodate or conform to the protrusions or the foreign matter.

The planar shapes of the intermediate layer 5 and the patterned resin layer 7 may be the same or different from the shape of the support member 3. It is preferred that the intermediate layer 5 and the patterned resin layer 7 have generally the same size in a plane (length by width) but if desired, the intermediate layer 5 may be adapted to have a larger size in a plane (length by width) than the patterned resin layer 7. In general, the support member 3 has a larger size in a plane (length by width) than the intermediate layer 5 and the patterned resin layer 7. This is because it is necessary to hold or grip the stamper 1 mechanically as a whole.

Reference should now be made to FIG. 2, which is a diagrammatic sectional view showing in detail the constitution of the nanoimprint resin stamper 1 shown in FIG. 1B. The intermediate layer 5 is bonded to the support substrate 3 by means of an adhesive layer 9 and the patterned resin layer 7 is bonded to the intermediate layer 5 via a planarizing film 11. The material that can be used to make the adhesive layer 9 may be exemplified by an UV curable polyester resin or an acrylic rubber-based optical adhesive. The UV curable polyester resin is preferred. The thickness of the adhesive layer 9 is not limited in any particular way and it may have the necessary sufficient thickness for bonding the intermediate layer 5 to the support substrate 3. The planarizing film 11 is used because the intermediate layer 5 has a rough surface and defies direct bonding of the patterned resin layer 7. The material that can be used to make the planarizing film 11 may be exemplified by an acrylic rubber-based optical adhesive (e.g. NOA65 commercially available from Norland Products Inc., U.S.A.) or an UV-curable polyester resin. The planarizing film 11 has a planar precision of about 1 µm, with the value for the reference plane being $\lambda/4$. The thickness of the planarizing film 11 may be of the necessary and sufficient value for planarizing the surface of the intermediate layer 5 by eliminating any irregularities on it. The pattern-forming surface of the patterned resin layer 7 is preliminarily coated with a release treated film 13. The release treated film 13 is effective in enhancing the ease with which the stamper 1 can be released from the transfer substrate (not shown). However, the use of the release treated film 13 is not an essential requirement to meet in the present invention. The material to form the release treated film 13 may be exemplified by a fluorine- or silicone-based material. The release treated film 13 may be formed by any suitable method such as spraying, evaporation, dipping or brushing. The thickness of the release treated film 13, if it is applied by dipping, is approximately a few nanometers.

Figure 3:
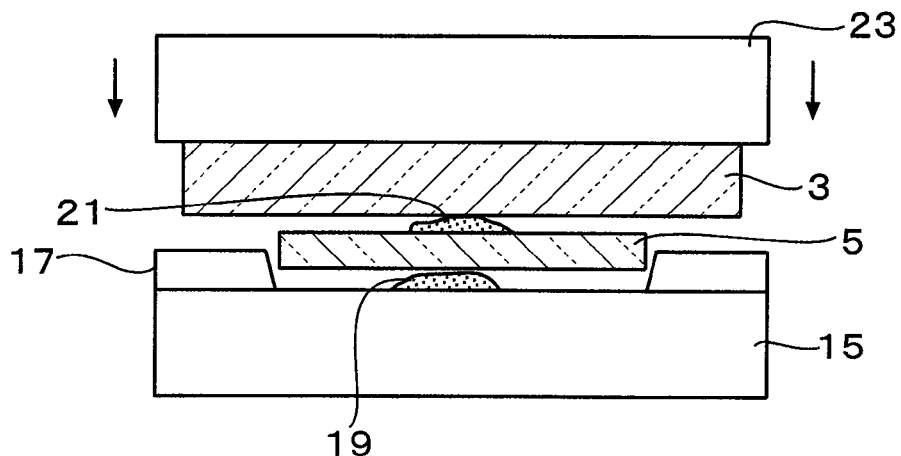
FIG. 3 is a diagrammatic view showing an exemplary processing method in which an intermediate layer 5 is bonded to a support substrate 3 and a planarizing film 11 is formed on the underside of the intermediate layer 5.

FIG. 3 is a diagrammatic view showing an exemplary processing method in which the intermediate layer 5 is bonded to the support member 3 and the planarizing film 11 is formed on the underside of the intermediate layer 5. An alignment plate 17 is provided on the topside of a lower planar plate 15. A suitable amount of a resin 19 for forming the planarizing film 11 is applied to a selected area of the topside of the lower planar plate 15; then, a suitable amount of a resin 21 for forming the adhesive layer 9 is also applied to a selected area of the topside of the intermediate layer 5; thereafter, an upper planar plate 23 holding the support member 3 is allowed to descend gently. The upper planar plate 23 may be pressed into contact with the underlying member; alternatively, the upper planar plate 23 may descend under its own weight for effecting the bonding and planarizing steps. After removing the applied pressure, the assembly is exposed to UV light for a suitable period of time until the resin hardens to complete the adhesive layer 9 and the planarizing film 11. Thereafter, the assembly is treated for mold release.

Figure 4:
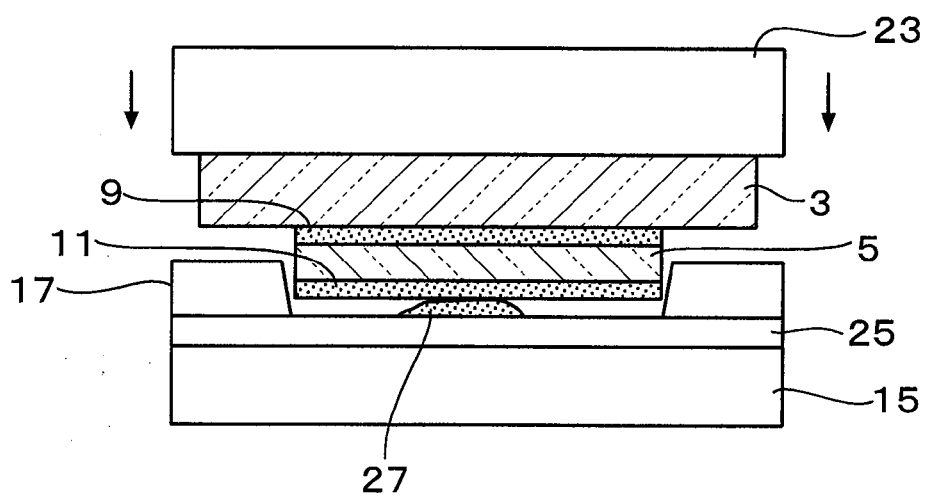
FIG. 4 is a diagrammatic view showing an exemplary processing method for forming a patterned resin layer 7 on the underside of the planarizing film 11.

FIG. 4 is a diagrammatic view showing an exemplary processing method for forming the patterned resin layer 7 on the underside of the planarizing film 11. A master 25 is placed on the topside of the lower planar plate 15 and the alignment plate 17 is provided on the topside of the master 25. A suitable amount of a photocurable resin 27 for forming the patterned resin layer 7 is applied to the topside of the master 25. The photocurable resin 27 may be applied by any conventional method such as a dispensing technique or a spin coating technique. In the dispensing technique, a drop of the photocurable resin 27 is deposited on a surface of the master 25. After the resin is applied, the upper planar plate 23 holding the support member 3 as it carries the adhesive layer 9 and the planarizing film 11 is allowed to descend gently for alignment. After the end of the alignment step, a predetermined pressure is applied to the upper planar plate 23 so that the planarizing film 11 is pressed into contact with the master 25. Since the master 25 is contacted by the planarizing film 11, the deposited drop of photocurable resin 27 spreads all over the surfaces of the master 25 and the planarizing film 11. Upon further application of pressure, the thickness of the patterned resin layer 7 formed can be reduced. With continued application of pressure, the assembly is exposed to UV light for a suitable period of time until the resin hardens to form the patterned resin layer 7 to which the pattern of the master 25 has been transferred. Since the patterned resin layer 7 does not have good release properties with respect to the master 25, it may sometimes break if it is immediately stripped from the master 25. To avoid this problem, it is preferred to perform a treatment for mold release in water. Needless to say, the very preparation of the master 25 is not a part of the constitution of the present invention. The master 25 can be prepared by any conventional method that is known to skilled artisans. For instance, the master 25 can be prepared by exposure using electron beams, exposure using X-rays, or by exposure using ion beams.

Figure 5:
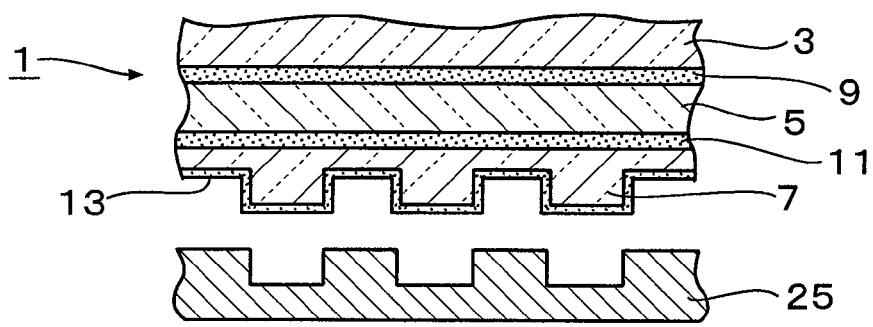
FIG. 5 is a sectional view showing partially enlarged the nanoimprint resin stamper 1 of the present invention as obtained by the processing scheme shown in FIG. 4.

FIG. 5 is a sectional view showing partially enlarged the nanoimprint resin stamper 1 of the present invention as obtained by the processing scheme shown in FIG. 4. If the pattern of the master 25 is recessed, the patterned resin layer 7 has an opposite, embossed pattern. Conversely, if the pattern of the master 25 is embossed, the patterned resin layer 7 has a recessed pattern. Subsequently, a release treated film 13 is deposited on the outer surface of the patterned resin layer 7.

Figure 6:
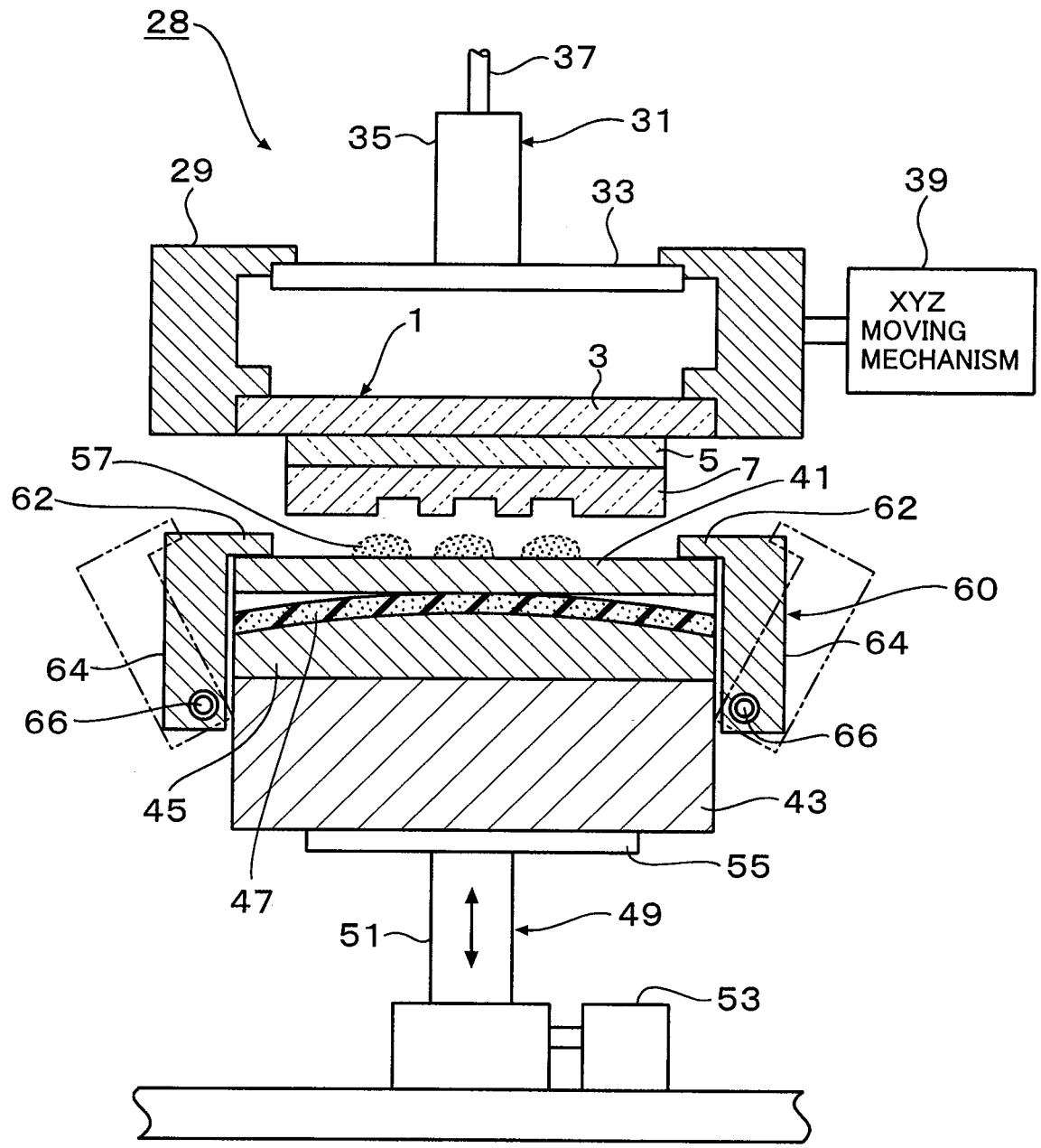
FIG. 6 is a diagrammatic compositional view showing an example of the nanostructure transfer apparatus according to the second aspect of the present invention.

FIG. 6 is a diagrammatic compositional view showing an example of the nanostructure transfer apparatus according to the second aspect of the present invention. In the nanostructure transfer apparatus according to the second aspect of the present invention which is indicated by 28, the resin stamper 1 is detachably held by a stamper holding jig 29. As already mentioned, the resin stamper 1 can be transported automatically since it has the light transmitting, rigid support member 3; what is more, this support member 3 allows the resin stamper 1 to be detachably held by the stamper holding jig 29. An exposure unit 31 is held on top of the stamper holding jig 29. The exposure unit 31 comprises an UV irradiating plate (e.g., sapphire plate) 33, an irradiating lens 35, and an UV lightguide means (e.g., optical fiber) 37. Although not shown, the stamper holding jig 29 is linked to an XYZ moving mechanism 39, which enables automatic alignment of the resin stamper 1.

Referring further to the nanostructure transfer apparatus 28 according to the second aspect of the present invention, a placement table 45 on which a transfer substrate 41 is to be placed is provided on the topside of a stage 43. A cushion layer 47 is secured to the topside side of the placement table 45. The placement table 45 has a curved surface. This curved placement table 45 has the following advantage: when the transfer substrate 41 is being pressed into contact with the resin stamper 1, the central part of the transfer substrate 41 first makes intimate contact with the resin stamper 1 and the other areas follow, whereby the air present at the interface between the transfer substrate 41 and the resin stamper 1 is gradually displaced toward the outer periphery of the transfer substrate 41 until the transfer substrate 41 is completely brought into intimate contact with the resin stamper 1. As a result, the base layer becomes uniformly thin and the quality of the final product is markedly improved. With the conventional optical transfer-based nanostructure transfer apparatus, the imprinting step has to be performed in a vacuum atmosphere at about $10^{-2}$ Torr in order to prevent air bubbles from entrapped within the photocurable resin during contact between the mold and the transfer substrate so that there will be no pattern deterioration. In the present invention which uses the curved placement table 45, there is no entrapping of air bubbles into the resin and the need of using a vacuum atmosphere is totally eliminated. The curvature of the curved surface of the placement table 45 varies with the size of the transfer substrate and it is generally preferred that its radius of curvature is within the range of 5 m to 20 m. If the curvature radius of the placement table 45 is more than 20 m, the above-described effect it is intended for is not fully attained. On the other hand, if the curvature radius of the placement table 45 is less than 5 m, such a great load is required to press the entire surface of the placement table 45 that the resin stamper and the transfer substrate may potentially be damaged.

Any material can be used to form the curved placement table 45, as exemplified by quartz, sapphire, glass, metals, plastics, and the like. The requirements that must be satisfied by the material to form the curved placement table 45 are that it be harder and have a higher modulus of elasticity than the material for the cushion layer that is to be provided over the curved placement table 45, and that it have sufficient strength and can be processed to produce a desired curved surface. In the illustrated embodiment, the curved surface of the placement table 45 is the highest in the center and gradually levels off toward the outer periphery, but this is not the sole case of the present invention and other modes are possible. For example, the curved surface may be a spherical surface having the same curvature in all areas or it may be an aspheric surface such that the region where a nano-scale pattern is to be transferred (which region is hereinafter referred to as the "pattern transfer region") has a greater curvature than the areas outside of it. The highest position of the curved placement table 45 is by no means limited to the single site at the center of the pattern transfer region and it may be set somewhere off the center of the pattern transfer region. If desired, the highest position of the curved placement table 45 may be created by providing a continuous ridge that encircles like a crown to define a closed region.

The function of the cushion layer 47 is such that when the resin stamper 1 is being pressed into contact with the transfer substrate 41, the latter can be compressed with a pressure distribution that corresponds to the curvature of the placement table 45. The material to form the cushion layer 47 may be exemplified by silicone rubbers, polystyrene resins, polyimide resins, polycarbonate resins, and the like. The thickness of the cushion layer 47 is generally within the range of 0.5 mm to 20 mm. If the thickness of the cushion layer 47 is less than 0.5 mm, the pressure distribution being applied will change abruptly, making it impossible to compress the entire surface of the transfer substrate 41. On the other hand, if the thickness of the cushion layer 47 exceeds 20 mm, the change in the pressure distribution is so small that the intended effect for removing air bubbles cannot be obtained. Needless to say, the topside of the cushion layer 47 is a curved surface that conforms to the curved surface of the placement table 45.

The stage 43 is formed of metals (e.g. stainless steel or aluminum), ceramics, plastics (e.g. silicone rubber), or the like. The stage 43 can be moved up and down by an ascending/descending mechanism 49. The ascending/descending mechanism 49 may typically be of such a type that a ball screw 51 is driven stepwise by a stepping motor 53 and that the pressure (load) being applied is detected with a load cell 55. Needless to say, other types of ascending/descending mechanism may be employed, as exemplified by hydraulic units that are operated by the pressure of either water or oils.

The transfer substrate 41 is a member to which the nanoscale pattern formed in the patterned resin layer 7 of the stamper 1 is transferred. The material that can be used to make the transfer substrate 41 is selected from among silicone, glass, metals (e.g. aluminum), synthetic resins (e.g. polyester resins and acrylic resins), and so forth. If necessary, a metal layer, a resin layer, an oxide film layer or the like may be preliminarily formed on a surface of the transfer substrate 41. The transfer substrate 41 may assume any desired shape such as a circle, an ellipse, a rectangle or a polygon. A substrate in the form of a doughnut-shaped disk may also be employed.

Applied to the topside of the transfer substrate 41 are spots of a photocurable resin 57 that serves as the material to form a patterned nanoimprint layer 72 to be described later (see FIG. 7B). Various methods may be used to apply the photocurable resin 57 and they include an inkjet method, a dispensing method, a spin coating method, and the like. The inkjet method is preferred since it provides ease in strictly controlling the coating weight of the photocurable resin 57 and the latter can be selectively applied to the areas as are required by the patterned resin layer 7. The inkjet method is implemented with an inkjet printer. The timing of applying the photocurable resin 57 to the transfer substrate may be either prior to or after the transfer substrate 41 is placed on the curved placement table 45. The photocurable resin 57 may be a composition that comprises a resin material to which a photosensitizer is added. Examples of the resin material include polyesters, cycloolefin polymers, polymethyl methacrylate (PMMA), polystyrene polycarbonate, polyethylene terephthalate (PET), polylactic acid, polypropylenes, polyethylenes, polyvinyl alcohol, and the like. Examples of the photosensitizer include peroxides, azo compounds, ketones, diazoaminobenzene, complex salts of metals, and the like. The proportions of the resin material and the photosensitizer can be determined as appropriate by skilled artisans.

A major feature of the nanostructure transfer apparatus 28 according to the second aspect of the present invention is that it has a clamp mechanism 60 for holding the transfer substrate 41 as it is placed on the curved placement table 45. After the transfer substrate 41 is placed on the curved placement table 45, the clamp mechanism 60 clamps it from its outer periphery toward the center such that it is brought into intimate contact with the cushion layer 47 over the curved placement table 45. The clamp mechanism 60 has clamp fingers 62 for gripping the transfer substrate 41. Each of the clamp fingers 62 extends radially inward in such a way that it contacts the topside of the outer periphery and its nearby area of the transfer substrate 41. The clamp mechanism 60 also has clamp arms 64, each being axially supported by a shaft 66 to be capable of pivoting radially outward. This enables the clamp fingers 62 to be engaged with or disengaged from the topside of the transfer substrate 41. One may use clamp mechanisms other than what is shown in FIG. 6. In the prior art in which the stamper 1 is pressed into contact with the transfer substrate 41 and a photo-curing treatment is simply done, the two members adhere to each other so strongly that they are extremely difficult to separate. However, according to the present invention, the clamp fingers 62 are brought into engagement with the topside of the transfer substrate 41 which is then clamped in preparation for a photo-curing treatment, and after the photo-curing treatment is done, the stage 43 is allowed to descend by the ascending/descending mechanism 49, whereupon the stamper 1 can be easily separated from the transfer substrate 41. As a result, the problems with the conventional practice of driving a wedge between the stamper 1 and the transfer substrate 41, i.e., damage to the stamper 1 and the occurrence of foreign matter, can be completely avoided, with the additional advantage of a marked improvement in the throughput of the nanoimprint process.

Figure 7A:
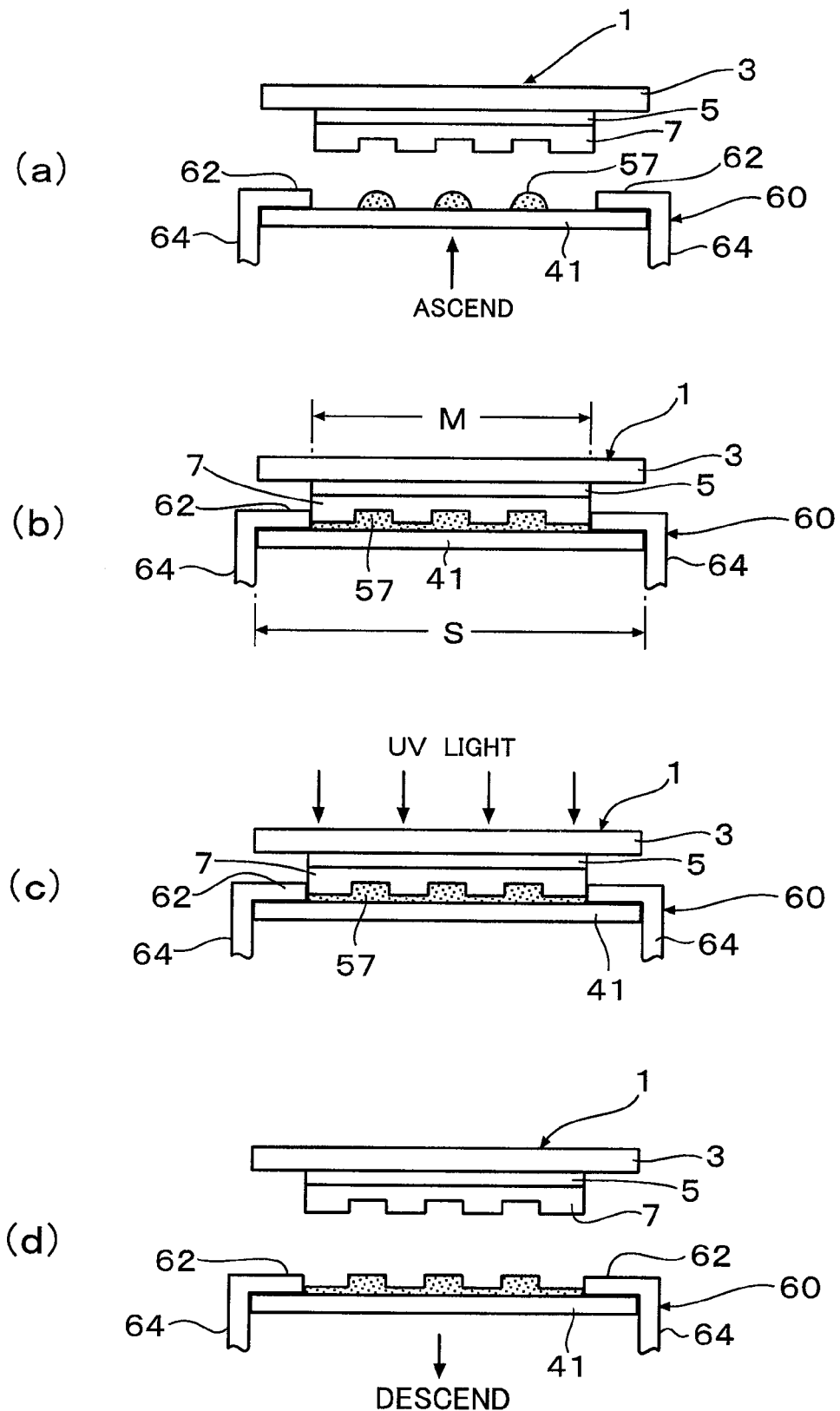
FIG. 7A is a diagrammatic illustration showing the sequence of working steps to form a nanoimprint pattern on a transfer substrate 41 with the nanoimprint resin stamper 1 of the present invention.

FIG. 7A is a diagrammatic illustration showing the sequence of working steps to form a nanoimprint pattern on the transfer substrate 41 with the nanoimprint resin stamper 1 according to the first aspect of the present invention. In step (a), the transfer substrate 41 having a photocurable resin 57 applied to predetermined areas is clamped with the clamp mechanism 60 and allowed to ascend toward the resin stamper 1. The photocurable resin 57 may typically be applied to the transfer substrate 41 by means of an inkjet printer. Other methods that can be used to apply the photocurable resin 57 include a dispensing method and a spin coating method. In step (b), the resin stamper 1 and the transfer substrate 41 are pressed into intimate contact with each other. As shown, the size M of the patterned resin layer 7 must be smaller than the size S of the transfer substrate 41. If this requirement is met, the transfer substrate 41 can be clamped by the clamp mechanism 60 and the resin stamper 1 can be brought into intimate contact with the transfer substrate 41. In addition, the transfer substrate 41 can be automatically stripped from the resin stamper 1. In step (c), exposing UV light is applied from above the resin stamper 1 to harden the photocurable resin 57. In step (d) which follows the curing process, the transfer substrate 41 is allowed to descend as it remains clamped by the clamp mechanism 60 until it is separated from the resin stamper 1.

Figure 7B:
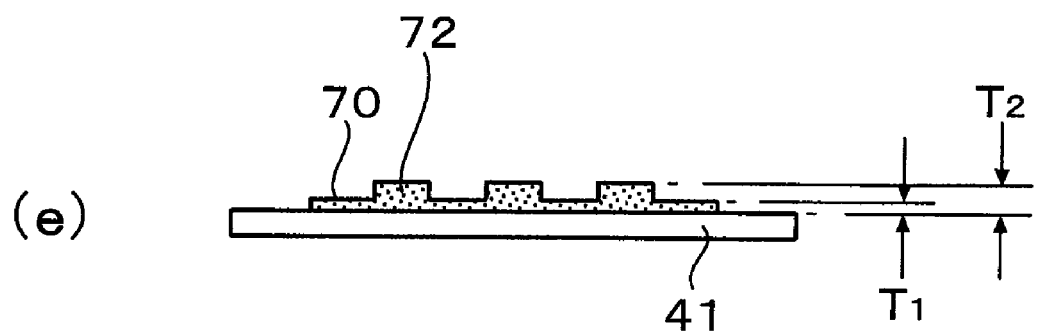
FIG. 7B is a diagrammatic illustration showing the sequence of subsequent working steps to form a nanoimprint pattern on the transfer substrate 41 with the nanoimprint resin stamper 1 of the present invention.
Figure 7B:
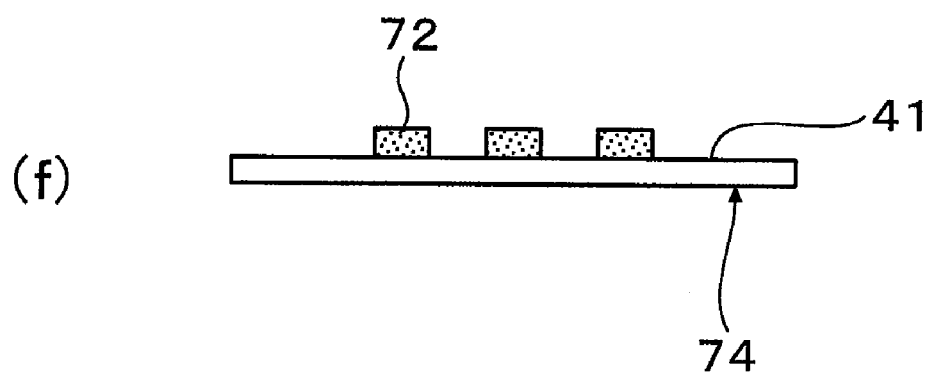

FIG. 7B is a diagrammatic illustration showing the sequence of subsequent working steps to form the nanoimprint pattern on the transfer substrate 41 with the nanoimprint resin stamper 1 according to the first aspect of the present invention. In step (e), the clamp mechanism 60 is disengaged from the transfer substrate 41 to recover it as it carries the nanoimprint pattern on its top. Formed on the topside of the transfer substrate 41 are a base layer 70 with a thickness of T1 as measured from the surface and a nanoimprint patterned layer 72 with a thickness of T2. The advantage of using the nanoimprint resin stamper 1 of the present invention is that even if some foreign matter is present in the gap between the stamper 1 and the transfer substrate 41 or if any protrusions occur on the surface of the transfer substrate 41, the thickness T1 of the base layer 70 can be made extremely smaller than in the case where the nanoimprint process is performed with the conventional rigid mold. As a result, dry etching need be performed only moderately in order to remove the base layer 70. In step (f), the transfer substrate 41 obtained in step (e) is dry etched in an etching apparatus in the presence of oxygen to remove the base layer 70, whereby a finished nanoimprint product 74 is obtained. If necessary, a rinse step may be performed before step (f) in order to wash away the unhardened photocurable resin.

On the following pages, the nanoimprint resin stamper according to the first aspect of the present invention and the nanostructure transfer apparatus according to the second aspect of the present invention are illustrated by referring to a specific example, which is by no means intended to limit the scope of the present invention.

EXAMPLE 1

This example describes an operation that uses the nanoimprint resin stamper 1 of FIG. 5 to transfer a nano-scale pattern from the patterned resin layer 7 to the transfer substrate 41 by means of the nanostructure transfer apparatus of FIG. 6.

In the nanostructure transfer apparatus 28, a placement table 45 having a curved surface on one side is placed on top of a vertically movable stainless steel stage 43. The placement table 45 was formed of optical glass having a diameter of 100 mm, a thickness of 20 mm, and a curvature radius R of 10.38 m. A cushion layer 47 made of silicone rubber measuring 40 mm on each side with a thickness of 8 mm was provided over the curved surface of the placement table 45; a PET sheet with alignment marks that measured 100 mm in diameter and 0.1 mm thick was interposed between the cushion layer 47 and the placement table 45. The silicone rubber of which the cushion layer 47 was made was more flexible than the optical glass of which the placement table 45 was formed.

A resin stamper 1 was composed of a support member 3 in the form of a transparent polyacrylic plate measuring 62 mm on each side with a thickness of 1 mm, an intermediate layer 5 made of polyurethane rubber measuring 42 mm on each side with a thickness of 1 mm, and a patterned resin layer 7 made of a photocurable polyethylene resin in a thickness of 0.001 mm to 0.01 mm. Acrylic rubber was used in an adhesive layer 9 between the support member 3 and the intermediate layer 5, and NOA65 (UV curable adhesive commercially available from Norland Products Inc.) was used in a planarizing layer 11 on the intermediate layer 5. The pattern-forming surface of the patterned resin layer 7 was coated with OPTOOL DSX (fluorine-containing release agent available from DAIKIN INDUSTRIES, Ltd.) The patterned resin layer 7 had a pattern of 100 nm wide parallel trenches formed in its surface on a pitch of 200 nm to a depth of 150 nm. The resin stamper 1 was fixed to a stamper holding jig 29.

A silicon wafer with a diameter of 50 mm was used as a transfer substrate 41. The topside of the transfer substrate 41 was coated by a commercial inkjet printer with a photocurable acrylate resin 57 in correspondence to the pattern in the patterned resin layer 7 after it was conditioned to a viscosity of 4 cP (4 mPas). The coating coverage of the acrylate resin was 37.5% and the drive voltage was 13.3 volts. The thus treated transfer substrate 41 was placed over the cushion layer 47 on top of the placement table 45 and clamped with a clamp mechanism 60. Thereafter, the stamper holding jig 29 was finely adjusted with an XYZ moving mechanism 39 to place the resin stamper 1 in alignment.

The stage 43 was allowed to ascend toward the resin stamper 1 so that the transfer substrate 41 was pressed into contact with the resin stamper 1 at a thrust of 0.15 kN×3. Thereafter, UV light was applied from an exposure unit 31 to pass through the light transmitting resin stamper 1, whereupon the photocurable acrylate resin 57 on top of the transfer substrate 41 hardened. The exposure time was 240 seconds. After the resin hardened, the stage 43 was allowed to descend. Since the transfer substrate 41 was clamped to the stage 43 by means of the clamp mechanism 60, it automatically separated from the resin stamper 1 as the stage 43 descended. The surface of the transfer substrate 41 was examined with a scanning electron microscope, showing the formation of a nanoimprint patterned layer 72 comprising 100 nm wide parallel trenches that had been formed in that surface on a pitch of 200 nm to a depth of 150 nm. This nanoimprint patterned layer 72 had the same pattern as the protrusions from the master 25.

On the foregoing pages, the resin stamper and nanostructure transfer apparatus of the present invention have been described with a focus being put on the UV nanoimprint process; however, the applicability of the resin stamper and nanostructure transfer apparatus of the present invention is by no means limited to the UV nanoimprint process and, if desired, they may be applied to the thermal imprint or the soft lithographic process, provided that each of these alternative methods may be modified as required in any suitable way that is known to skilled artisans, as exemplified by providing a heating/cooling means.

The resin stamper and nanostructure transfer apparatus of the present invention are applicable not only to the fabrication of high-capacity media disks (both magnetic and optical), semiconductors and ultrahigh-density printed wiring boards but also to the manufacture of other devices including biosensors, DNA chips, micro-channel devices, FED/SED, organic ELs, highly functional optical members, nano-lens arrays, optical ICs, optical devices, optical interconnections, and organic semiconductors.

What is claimed is:

1. A resin stamper for use in an ultraviolet (UV) nanoimprint process comprising:
    a support member made of a light transmitting material and having mechanical strength;
    an intermediate layer also made of light transmitting material; and
    a patterned resin layer which is also made of light transmitting material,
    wherein the support member is larger in size than the intermediate layer and the patterned resin layer, the intermediate layer is more flexible than the patterned resin layer, and the patterned resin layer has a pattern of high and low areas formed in a surface thereof that is the obverse of the pattern of high and low areas in a mold, and
    wherein a planarizing film made of light transmitting material such as an acrylic rubber-based optical adhesive or an UV-curable polyester resin is disposed at the interface between the intermediate layer and the patterned resin layer.

2. The resin stamper according to claim 1, further comprising a release treated film made of a light transmitting material that is present on a surface of the patterned resin layer.

3. The resin stamper according to claim 1, wherein the support member is made of a material selected from the group consisting of glass, quartz, sapphire, and transparent plastics,
    wherein the intermediate layer is made of a material selected from the group consisting of a polyurethane rubber sheet, a silicone rubber sheet, and an acrylic rubber sheet, and
    wherein patterned resin layer is made of a material selected from the group consisting of a UV curable polyester and an acrylic rubber.

4. A nanostructure transfer apparatus that uses the resin stamper according to claim 1 as a mold, comprising:
    a stage supported by an ascending/descending mechanism;
    a placement table with a curved surface that is provided over the stage, the placement table having a cushion layer that is provided over a surface of the placement table and which conforms to the curved surface thereof; and
    a clamp mechanism for clamping a transfer substrate onto the placement table as it is placed on top of the cushion layer over the placement table,
    wherein the patterned resin layer of the resin stamper is smaller in size than the transfer substrate.

5. A resin stamper according to claim 1, wherein the support member has a thickness in the range of 0.5 to 10 mm.

6. A resin stamper for use in an ultraviolet (UV) nanoimprint process comprising:
    a support member made of a light transmitting material;
    an intermediate layer also made of light transmitting material; and
    a patterned resin layer which is also made of light transmitting material,
    wherein the support member is larger in size than the intermediate layer and the patterned resin layer, the intermediate layer is more flexible than the patterned resin layer, and the patterned resin layer has a pattern of high and low areas formed in a surface thereof that is the obverse of the pattern of high and low areas in a mold, and
    wherein a planarizing film made of light transmitting material is disposed at the interface between the intermediate layer and the patterned resin layer.

7. The resin stamper according to claim 6, further comprising a release treated film made of a light transmitting material that is present on a surface of the patterned resin layer.

8. The resin stamper according to claim 6, wherein the support member is made of a material selected from the group consisting of glass, quartz, sapphire, and transparent plastics,
    wherein the intermediate layer is made of a material selected from the group consisting of a polyurethane rubber sheet, a silicone rubber sheet, and an acrylic rubber sheet, and
    wherein the patterned resin layer is made of a material selected from the group consisting of a UV curable polyester and an acrylic rubber.

9. A nanostructure transfer apparatus that uses the resin stamper according to claim 6 as a mold, comprising:
    a stage supported by an ascending/descending mechanism;
    a placement table with a curved surface that is provided over the stage, the placement table having a cushion layer that is provided over a surface of the placement table and which conforms to the curved surface thereof; and
    a clamp mechanism for clamping a transfer substrate onto the placement table as it is placed on top of the cushion layer over the placement table,
    wherein the patterned resin layer of the resin stamper is smaller in size than the transfer substrate.

10. A resin stamper according to claim 6, wherein the support member has a thickness in the range of 0.5 to 10 mm in order to provide mechanical strength.

11. A resin stamper according to claim 6, wherein the planarizing film is made from one of an acrylic rubber-based optical adhesive and a UV-curable polyester resin.

12. A resin stamper according to claim 11, wherein the planarizing film is made from one of an acrylic rubber-based optical adhesive and a UV-curable polyester resin.

* * * * *